(12) United States Patent
Kasai et al.

(10) Patent No.: US 7,432,573 B2
(45) Date of Patent: Oct. 7, 2008

(54) SURFACE-SPINTRONICS DEVICE

(75) Inventors: Hideaki Kasai, Osaka (JP); Hiroshi Nakanishi, Osaka (JP); Tomoya Kishi, Hyogo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 311 days.

(21) Appl. No.: 10/561,616

(22) PCT Filed: Jun. 23, 2004

(86) PCT No.: PCT/JP2004/009226

§ 371 (c)(1),
(2), (4) Date: Dec. 20, 2005

(87) PCT Pub. No.: WO2004/114415

PCT Pub. Date: Dec. 29, 2004

(65) Prior Publication Data

US 2006/0186433 A1 Aug. 24, 2006

(51) Int. Cl.
*H01L 29/82* (2006.01)
(52) U.S. Cl. ............... 257/421; 257/422; 257/E29.167
(58) Field of Classification Search ............... 257/421, 257/422, E29.167
See application file for complete search history.

(56) References Cited

OTHER PUBLICATIONS

Kishi et al. "Stable Structure of Fe Nanowires on Cu(111)," Jpn. J. Appl. Phys. vol. 42 pp. 4633, Jul. 2003.*
H.C. Manoharan, et al., "Quantum mirages formed by coherent projection of electronic structure", 2000 Macmillan Magazines Ltd., Letters to Nature, Nature/vol. 403, Feb. 3, 2000, pp. 512-515.
Andrew Zangwill, "Physics at Surfaces", Electronic Structure, Photoelectron Spectroscopy, p. 72.
P. Hohenberg, et al., "Inhomogeneous Electron Gas", Physical Review, vol. 136, No. 3B, Nov. 9, 1964, pp. B864-B871.
W. Kohn, et al., "Self-Consistent Equations Including Exchange and Correlation Effects", Physical Review, vol. 140, No. 4A, Nov. 15, 1965, pp. A1133-A1138.

(Continued)

*Primary Examiner*—Bradley W. Baumeister
*Assistant Examiner*—Matthew L Reames
(74) *Attorney, Agent, or Firm*—Westerman, Hattori, Daniels & Adrian, LLP.

(57) ABSTRACT

A surface-spintronic device operating on a novel principles of operations may be implemented as a spin conducting, a spin switching or a spin memory device. It includes a magnetic atom thin film (13) layered on a surface of a solid crystal (12) and a drain and a source electrodes (14) and (15) disposed at two locations on the magnetic atom thin film, respectively, whereby a spin splitting surface electronic state band formed in a system comprising said solid crystal (12) surface and said magnetic atom thin film (13) is utilized to obtain a spin polarized current flow. With electrons spin-polarized in a particular direction injected from the source electrode (15), controlling the direction of magnetization of the magnetic atom thin film (13) allows switching on and off the conduction of such injected electrons therethrough. Also, with the use of the magnetization holding function of the magnetic atom thin film (13), it is possible to realize a spin memory device that can operate to write information on controlling the direction of magnetization of the magnetic atom thin film (13) and that can operate to read information on detecting the electrodes (15, 14).

18 Claims, 7 Drawing Sheets

OTHER PUBLICATIONS

Takeo Fujiwara, "Lotai Denshi Kozo" (Electronic Structure of Solid State), Asakura Shoten, Chapter 3, pp. 51-87.

J. Shen, et al., "The effect of spatial confinement on magnetism: films, stripes and dots of Fe on Cu(111)", Institute of Physics Publishing, Journal of Physics: Condensed Matter, J. Phys.: Condens. Matter 15 (2003) R1-R30, 2003 IOP Publishing Ltd., pp. R1-R30.

Translation of the International Preliminary Report on Patentability of International Application No. PCT/JP 2004/009226, with Form PCT/IB/338, PCT/IB/373 and Form PCT/ISA/237.

Tomoya Kishi et al.; "Magnetic Properties of Fe Thin Films on Cu(111)", Journal of the Physical Society of Japan, vol. 71, No. 12, Dec. 2002, pp. 2983-2985. Cited in the int'l. search report.

G. Brown et al.; "Model of Fe nanostripes on Cu(111)", Journal of Applied Physics, vol. 91, No. 10, May 15, 2002, pp. 7056-7058. Cited in the int'l. search report.

\* cited by examiner (a)

( Energy Origin is Fermi Energy. )

(b)

Brillouin Zone of Cu ( 1 1 1 ) Surface

- ·······♦······· : Majority spin electron state band
- ——□—— : Minority spin electron state band
- ⋰⋱ : Majority spin surface electron state
- ◯ : Minority spin surface electron state (a)

(b)

SURFACE-SPINTRONICS DEVICE

TECHNICAL FIELD

The present invention relates to spintronic (spin electronic) devices and, more particularly, to a spin conducting, a spin switching and a spin memory device, as a spintronic device.

BACKGROUND ART

Electronics has hitherto placed its basis on a charge of an electron. However, since an electron has a spin as its other attribute besides its charge and in recent years the limits of electronics placed its basis on the charge have begun to be seen, researches and developments have rapidly been put forward on spintronics, namely spin electronics, which is based on the spin of an electron.

For example, as a device utilizing a spin there is now a GMR (Giant Magneto Resistance) device, which has been put to practical use as a read-out device for magnetic hard disk memories, making it possible to achieve their present level storage capacity. There is also as a third-generation spintronic device a MRAM (Magneto Resistive Random Access Memory) using TMR (Tunnel Magneto Resistance) effect. The MRAM is being put to practical use as a next-generation nonvolatile memory that is low in power consumption, fast in reading and writing, and highly integrated.

In the spintronics, however, there have not yet been realized a conductor for passing a spin current (spin-polarized current) and a switch for turning on and off a spin current, which are corresponding to an electric current conductor and an electric current switch such as FET respectively. For example, while it has been proposed to utilize spin-injection from a ferromagnetic metal into a semiconductor, a problem of losing spin information upon the spin-injection remains unsolved and the prospect of its utilization can not still be foreseen.

In view of the problem mentioned above, the present invention has for its objects to provide a surface-spintronic spin conducting device that is capable of flowing a spin current based on a novel principle of operation, to provide a surface-spintronic spin switching device that is capable of switching a spin current with low power consumption, rapidly and efficiently, and to provide a surface-spintronic spin memory device utilizing the same.

DISCLOSURE OF THE INVENTION

In order to achieve an object as mentioned above, there is provided in accordance with the present invention a surface-spintronic spin conducting device, characterized in that it comprises a solid surface, a magnetic atom thin film layered on the solid surface, and electrodes mounted at two locations on the magnetic atom thin film, wherein a spin-splitting surface electronic state band formed in a system comprising the solid crystal surface and the magnetic atom thin film is utilized to cause a spin current to flow. The solid surface is preferably a nonmagnetic solid surface having surface projected bulk band gaps, which is preferably, e.g., a copper (111) surface or a covalent crystal surface so treated that it is terminated with hydrogen, and the magnetic atom thin film is a magnetic atom thin film having one to several atomic layers in thickness, e. g., of iron atoms.

According to the makeup mentioned above, a direction of magnetization of the magnetic atom thin film determines a spin orientation that can contribute to conduction in the surface electronic state band, and the surface-spintronic spin conducting device thus provided causes only a spin current of which the spin is so oriented.

And, if electrons consisting only of up spin or electrons consisting only of down spin are supplied from the electrode of the spin conducting device, a spin current flows when the spin orientation of supplied electrons coincides with that of the surface electronic state band and no spin current flows when that is not the case. By controlling the direction of magnetization in the magnetic atom thin film, it is possible to make the spin orientation in the surface electronic state band coincident or not coincident with the spin orientation of the supplied electrons, and for this reason, it is possible to switch a spin current on and off and to realize a spin switching device. The surface electronic state band that can contribute to conduction can be made either of up spin only electronic state or down spin only electronic state, therefore it is possible to switch a spin current on and off at an efficiency of 100%. Also said spin conducting device can be used as a unit element for spintronic logic circuit and as a magneto resistance element having an infinite changing rate of resistance. And also, it can also be used as a spin memory device, because a magnetization direction of the magnetic atom thin film, which is once controlled in one direction, remains held until next magnetization direction controlling is applied.

The surface-spintronic spin switching device and the surface-spintronic spin memory device in accordance with the present invention includes a control means as described below for controlling the direction of magnetization in the magnetic atom thin film.

Namely, the surface-spintronic spin switching device and the surface-spintronic spin memory device may be characterized in that the control means includes a conducting wire disposed laterally adjacent to the magnetic thin film and a means for flowing an electric current through the conducting wire to generate around it a magnetic field that is utilized to change the direction of magnetization in the magnetic atom thin film normal or reverse.

An alternative form of implementation of the control means in a surface-spintronic spin switching device and a surface-spintronic spin memory device in accordance with the present invention may be characterized by including an up spin and a down spin source disposed laterally adjacent to the magnetic atom thin film; a connection member connecting the up spin source to the magnetic atom thin film; a connection member connecting the down spin source to the magnetic atom thin film; a power supply for injecting spins of the up spin source or spins of the down spin source into the magnetic atom thin film, wherein by applying a voltage of the power supply so as to inject spins of the up spin or down spin into the magnetic atom thin film, its magnetization direction is changed into normal or reverse direction. Preferably, the up spin source and down spin source comprise of ferromagnetic metals magnetized upwards and downwards respectively, and each of the connection members comprises of a nonmagnetic metals.

According to the makeup mentioned above, it is possible to magnetize the magnetic thin film controllably in a desired direction and as a result to switch a spin current on and off. Further, a surface-spintronic device according to the present invention, which utilizes a surface electronic state band formed in a system comprising a solid surface and a magnetic atom thin film, can confine a spin current into an extremely small space and, as a result, can be made extremely small. Further, in switching a spin current on and off, the device only requires switching the spin orientation in the magnetic atom thin film made of one to several atomic layers, normally and reversely. Hence, the required energy is extremely small and there is realized an ultimate energy saving performance.

BEST MODES FOR CARRYING OUT THE INVENTION

Figure 1:
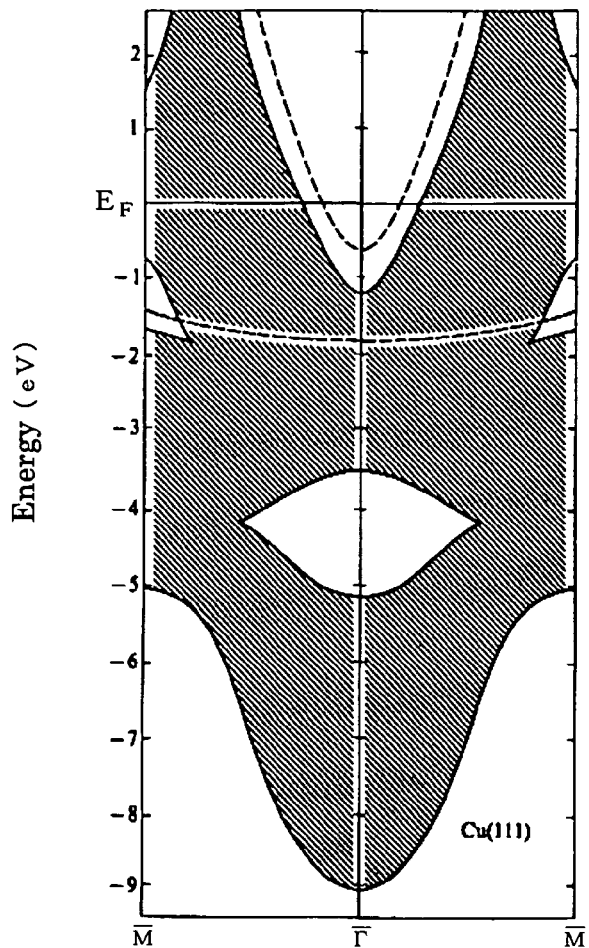
FIG. 1 shows a graph illustrating a structure of an electronic state band of copper (111) surface.
Figure 1:
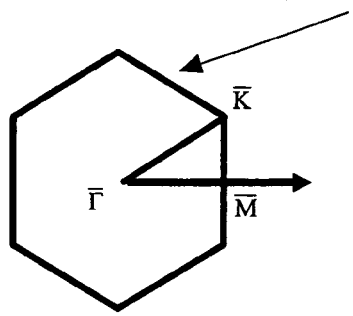

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof.

Hereinafter, the present invention will be described in detail in respect of suitable forms of implementation thereof with reference to the drawing figures.

Now, to facilitate understanding of the present invention, an explanation is given in detail of a surface-spintronic spin conducting device. Mention is made preliminarily of spin split surface electronic state bands formed in a magnetic atom thin film layered on a solid surface. Although here, for example, the solid surface is shown as a copper (111) surface and a magnetic atom thin film as an iron thin film, it should be understood that this is not a limitation.

Moreover, it is not intended that a surface-spintronic device according to the present invention be limited to the makeup described below, and any spintronic device that utilizes a spin split surface electronic state band should be taken to fall within the present invention.

FIG. 1 (a) is a graph illustrating surface electronic state bands of a copper (111) surface ( see "Physics at Surface" authored by Andrew Zangwill (Georgia Institute of Technology), Cambridge University Press, New York New Rochelle Melbourne Sydney). In the graph, the abscissa axis represents the wave number towards point M from point Γ in the surface plane and the ordinate axis represents the electronic state energy. In FIG. 1(b), the hexagon shown represents the Brillion zone of the copper (111) surface and characters Γ, M and K indicate directions of the wave number vector of the graph in a wave number space.

In FIG. 1(a), the shaded area represents a projection of the band structure of a copper bulk crystal onto the (111) surface and indicates that an electronic state continuously exists in this area of wave number and energy. If there exists an electron in this shaded area, then the electron will diffuse into the bulk crystal. Each area unshaved is called the surface projected bulk band gap, indicating that an electron having a wave number and energy that fall in the area cannot exist in the bulk crystal. The broken lines represent surface electronic state bands of the copper (111) surface, and especially, the surface electronic state band of the broken line located in the surface projection gap has a surface electronic state which has no intersection with any electronic state of the bulk crystal having the corresponding wave number and energy, thus causing an electron having those wave number and energy to remain localized having an atomic scale on the surface. Indeed, such a surface localized state has been confirmed to exist (see "Quantum mirages formed by coherent projection of electronic structure" authored by H. C. Manichaean, C. P. Lutz & D. M. Eagle, Nature, Vol. 403, pp. 512-515, 2000), and the present invention utilizes such energy states of electrons which can propagate through a surface.

Figure 2:
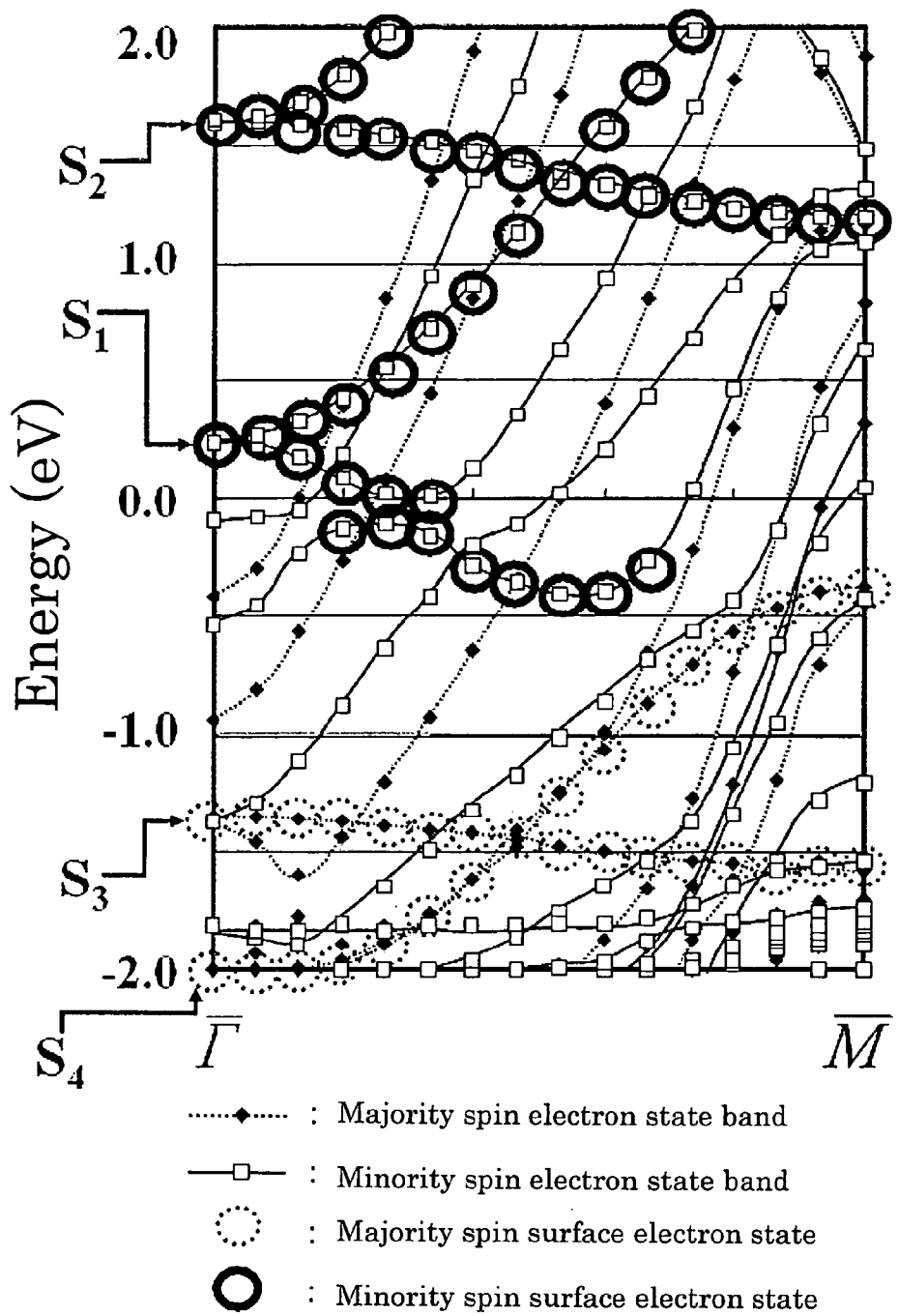
FIG. 2 is a graph illustrating computer experimental results for an electronic state band structure of a system of Cu (111) surface having a Fe atomic layer laid thereon.

FIG. 2 is a graph illustrating first principles calculation results of the band structure of a system in which one layer of iron atomic thin film was laid on a copper (111) surface by the present inventors. The first principles calculation is a computational technique based on the density functional theory showing that "the energy of the ground state of an interacting many-electron system is determined by the density distribution of electrons" (see P. Rothenberg and W. Kohn, Phys. Rev., 136, B864 (1964); W. Kohn and L. J. Sham, Phys. Rev., 140, A1133 (1965), see also "Coati Denshi Kozo" (Electronic Structure of Solid State) authored by Takeo Fujiwara, published by Asakura Shoten, Chapter 3). The first principles calculation makes it possible to discuss the electronic structure of a material quantitatively without an extra empirical parameter and, indeed, its effectiveness has been proved by a number of examples. In this calculation, the generalized gradient approximation is applied, of which the accuracy is now the highest in the first principles calculation.

In FIG. 2, the curves indicated with marks ♦ represent majority spin electron band while the curves indicated with marks ☐ represent minority spin electron bands. Here, where a system contains electrons each of which has up spin and electrons each of which has down spin, the majority spin means the spin which a larger number of such electrons have and the minority spin means the spin which a smaller number of such electrons have. Thus, the spin orientation of the whole, which is determined by their total, is equal to the orientation of the majority spin. And, if a contribution of the orbital magnetic moment is small, then the direction of magnetization is opposite to the spin orientation of the whole, then the direction of magnetization is equal to the orientation of the minority spin. Of electronic state bands as shown, two surface electronic state bands of minority spin S1 and S2 are indicated with solid circles and two surface electronic state bands of majority spin S3 and S4 are indicated with broken circles. Here, the surface electronic state band of minority spin refers to a surface electronic state band having the minority spin localized in an atomic scale on the vicinity of a magnetic atom thin film and oriented perpendicular thereto. Likewise, the surface electronic state band of majority spin here refers to a surface electronic state band having the majority spin localized in an atomic scale on the vicinity of a magnetic atom thin film and oriented perpendicular thereto As shown in FIG. 2, a majority spin electronic state and a minority spin electronic state differ in energy, whereby spin splitting occurs in this system. Also a minority spin surface electronic state bands S1, S2 and a majority spin surface electronic bands S3, S4 are formed in different energy regions, whereby spin splitting occurs for surface electronic bands. Of them, S1, S2 which exist in a surface projected bulk band gap can be utilized as an energy state for an electron propagating through a surface. Thus, the minority spin surface electronic state band S1 or S2 can be utilized to pass through a surface a spin current consisting only of spins of electrons capable of occupying that state.

Note here that which of up spin or down spin is a spin of an electron occupying the minority spin surface electronic state band S1 or S2 is determined by a direction of magnetization in the magnetic atom thin film.

An iron atom thin film that is of one or two atomic layers in thickness has its easy axis of magnetization perpendicular to its surface and magnetized upwards or downwards with respect thereto (see "The effect of spatial confinement on magnetism: films, stripes and dots of Fe on Cu (111)" authored by J. Shen, J. P. Pierce, E. W. Plummer & J. Kirschner, Journal of Physics: Condensed Matter, Vol. 15, R1-R30, 2003).

When the magnetization of an iron atom thin film is oriented upwards (then, the majority spin is the down spin and the minority spin is the up spin; this state is termed to a "normally polarized" state), the minority spin surface electronic bands S1 and S2 can be occupied with electrons exclusively of up spin. To wit, the electrons which can be injected into S1 or S2 and are allowed to propagate through the surface are electrons exclusively of up spin. On the other hand, when the magnetization of an iron atom thin film is oriented downwards (then, the majority spin is the up spin and the minority spin is the down spin; this state is termed to a "reversely polarized" state), S1 and S2 can be occupied with electrons exclusively of down spin. To wit, the electrons which can be injected into S1 or S2 and are allowed to propagate through the surface are electrons exclusively of down spin. This can be utilized to pass either a stream of electrons of up spin or a stream of electrons of down spin selectively and thus to pass a flow of perfect spin polarized electrons, namely a spin current, through the surface.

Now, in order to form a spin splitting surface electronic state band as mentioned above, it is necessary to form a magnetic atom thin film without destructing the crystallographic structure of a nonmagnetic crystal surface having a surface projected bulk band gap. It has been reported that depositing an iron atom thin film on a copper (111) surface by the laser MBE method permits forming such an iron atom thin film on the copper (111) surface without destructing its crystallographic structure (see "The effect of spatial confinement on magnetism: films, stripes and dots of Fe on Cu (111)" authored by J. Shen, J. P. Pierce, E. W. Plummer & J. Kirschner, Journal of Physics: Condensed Matter, Vol. 15,R1-R30, 2003). As another nonmagnetic crystal having a surface projected bulk band gap, there is Si (silicon) single crystal. With the recognition, however, that iron atoms tend to strip silicon atoms on a surface of the Si single crystal which is a covalent crystal, thereby forming suicide, it has hitherto been believed to be difficult to form an iron atom thin film on such a surface without destructing its crystal structure.

The present inventors have discovered by a computer experiment that if iron atoms are allowed to deposit on a Si (001) surface that has been terminated with hydrogen, it is then possible to form an iron atom thin film without destroying the Si (001) surface. Results of the computer experiment are shown below. The method of computation adopted is the first principles calculation according to the electronic state computing method based on the density functional theory.

Figure 3:
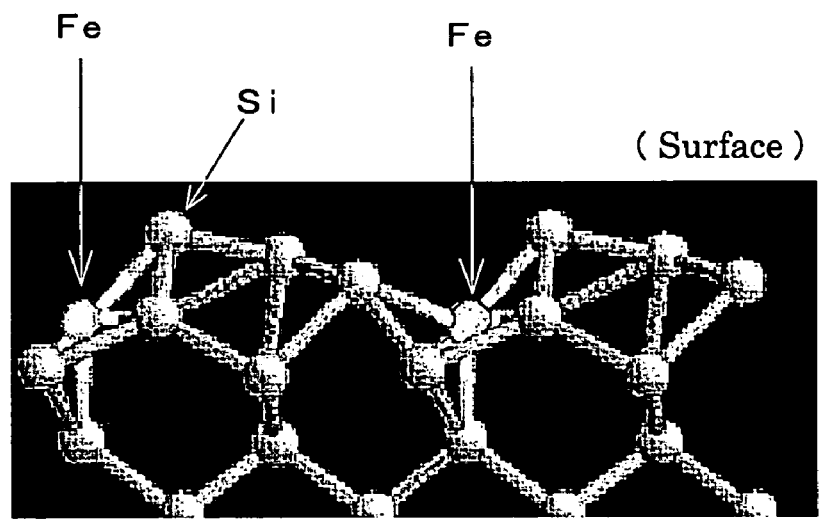
FIG. 3 shows computer experimental results, represented in crystallographic structural cross-sectional view, for surface structures of (a) Si (001) surface that has adsorbed Fe atoms and (b) a hydrogen terminated Si (001) surface that has adsorbed Fe atoms.
Figure 3:
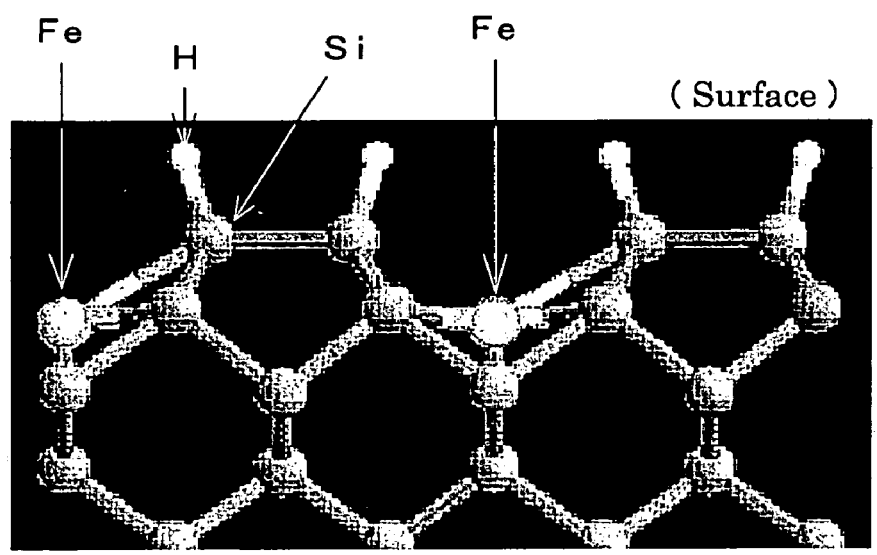

FIG. 3 shows computer experimental results, represented in crystallographic structural cross-sectional views, for surface structures of (a) a Si (001) surface that has adsorbed Fe atoms and (b) a hydrogen terminated Si (001) surface that has adsorbed Fe atoms. In FIG. 3(a) it is seen that a Fe atom deforms the arrangement of surface Si atoms, then combining with a Si atom and that having iron atoms adsorbed to a Si (001) surface as it is destructs the Si surface crystal structure. On the other hand, it is seen from FIG. 3(b) that the dimmer structure of surface Si atoms is preserved and that having iron atoms adsorbed on a Si (001) surface that has been ended with hydrogen causes iron atoms to bond with Si without destructing the crystal structure of the surface. It follows, therefore, that a Si (001) surface terminated by hydrogen can be used as a nonmagnetic crystal surface having a surface projection gap for a spintronic device according to the present invention.

In particular, noting that the Si (001) surface is the major surface of a Si wafer for fabricating an integrated circuit in the current electronics, the ability to build a spintronic device of the present invention on the Si crystal surface is advantageous in that it facilitates hybridizing conventional electronic circuits with spintronic circuits.

Figure 4:
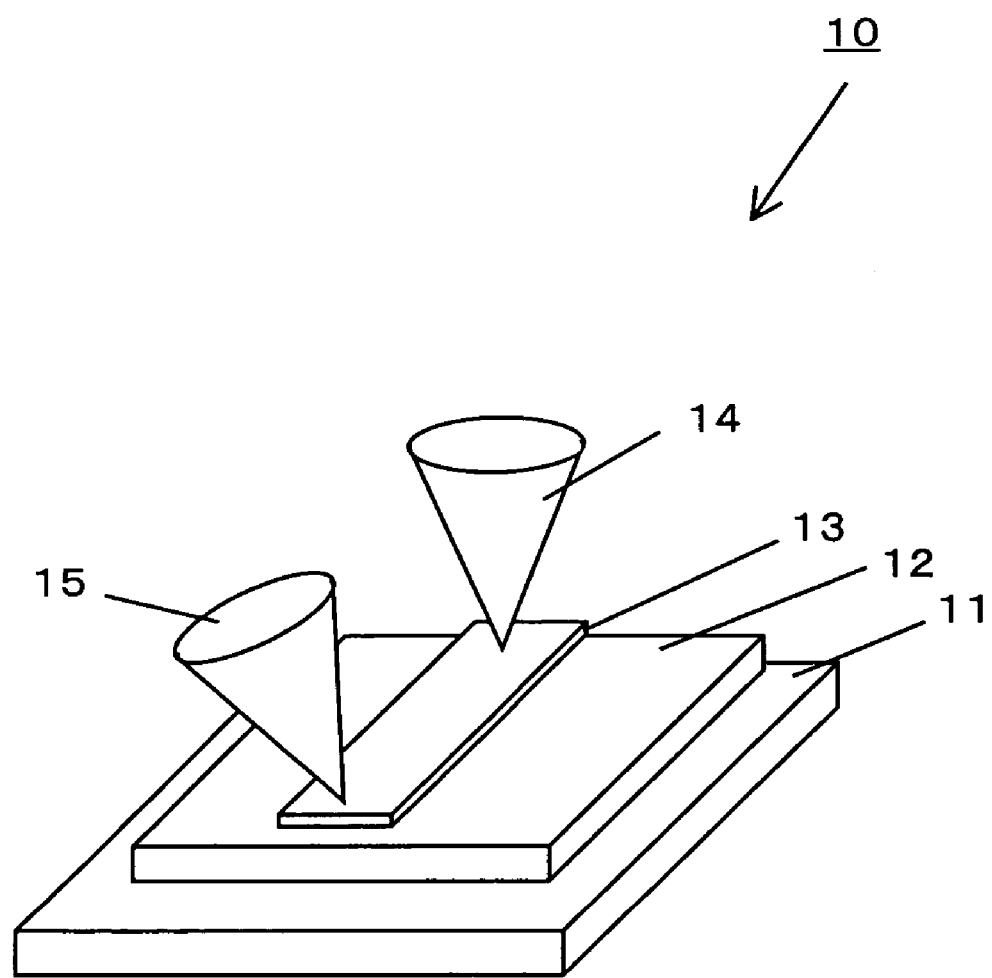
FIG. 4 is a diagrammatic view in perspective illustrating the makeup of a surface-spintronic spin conducting device according to the present invention.

Referring next to FIG. 4, an explanation is now given in respect of a suitable form of implementation of the surface-spintronic spin conducting device in accordance with the present invention. In FIG. 4, the spin conducting device, designated by reference character 10, is shown comprising a substrate 11, a solid crystal 12, a magnetic atom thin film 13 and a pair of electrodes as a drain and a source electrode 14 and 15, respectively. The substrate 11 supports the solid crystal 12 formed thereon and is made of an insulating material which should, preferably but not exclusively, be aluminum oxide or the like, when the solid crystal is copper.

The magnetic atom thin film 13 is formed on a surface of the solid crystal 12 having a surface projected bulk band gap so that it has a film thickness of one or several atom layers, and this system has spin splitting surface electronic state bands (S1, S2) that exist in the surface projected bulk band gap. Note here that though the magnetic atom thin film 13 is depicted to be rectangular, it may take any desired pattern to form a given spin current circuit in the spintronics just as a pattern to form an integrated circuit in the conventional electronics.

The drain and source electrodes 14 and 15 are mounted at two locations, respectively, on the magnetic atom thin film. Although the electrodes are each illustratively shown in the form of a probe for a scanning tunneling microscope for contact with the magnetic atom thin film, the contact may be by way of tunneling contact as in the ordinary use of STM as shown, namely by bringing the probe near the magnetic atom thin film surface to bring into point contact therewith, or otherwise by the usual way of sticking each electrode to the surface to establish facial contact therewith. By applying a bias voltage corresponding in energy to a surface electronic state band between the magnetic atom thin film 13 and the source electrode 15, it is possible to inject from the source electrode 15 into the thin film 13 those electrons selectively, whose spin is identical in orientation to the spin of electrons in the surface electronic state band. Electrons so injected are taken out at the drain electrode 14 which is higher in electric potential than the source electrode 15. In this way, electrons whose spin is identical in orientation to the spin of the surface electronic state band are caused to flow from the source electrode 15 through the magnetic atom thin film 13 to the drain electrode 14.

Thus, with the system of a magnetic atom thin film on a solid surface, a perfect spin-polarized electron current, namely spin conducting device is made possible, wherein either a flow of electrons of up spin or a flow of electrons of down spin is selectively conducted. In this way, the surface-spintronic spin conducting device 10 can be caused to function as a spin conductor. Moreover, since the spin direction of an electron to be conducted can be determined by the direction of magnetization in the magnetic atom thin film, if electrons being fed from the source electrode 15 are perfectly spin polarized beforehand by another surface-spintronic spin conducting device, or the like, it is possible to switch the conduction of a spin current on and off by magnetizing the magnetic atom thin film in the normal or the reverse directions.

Figure 5:
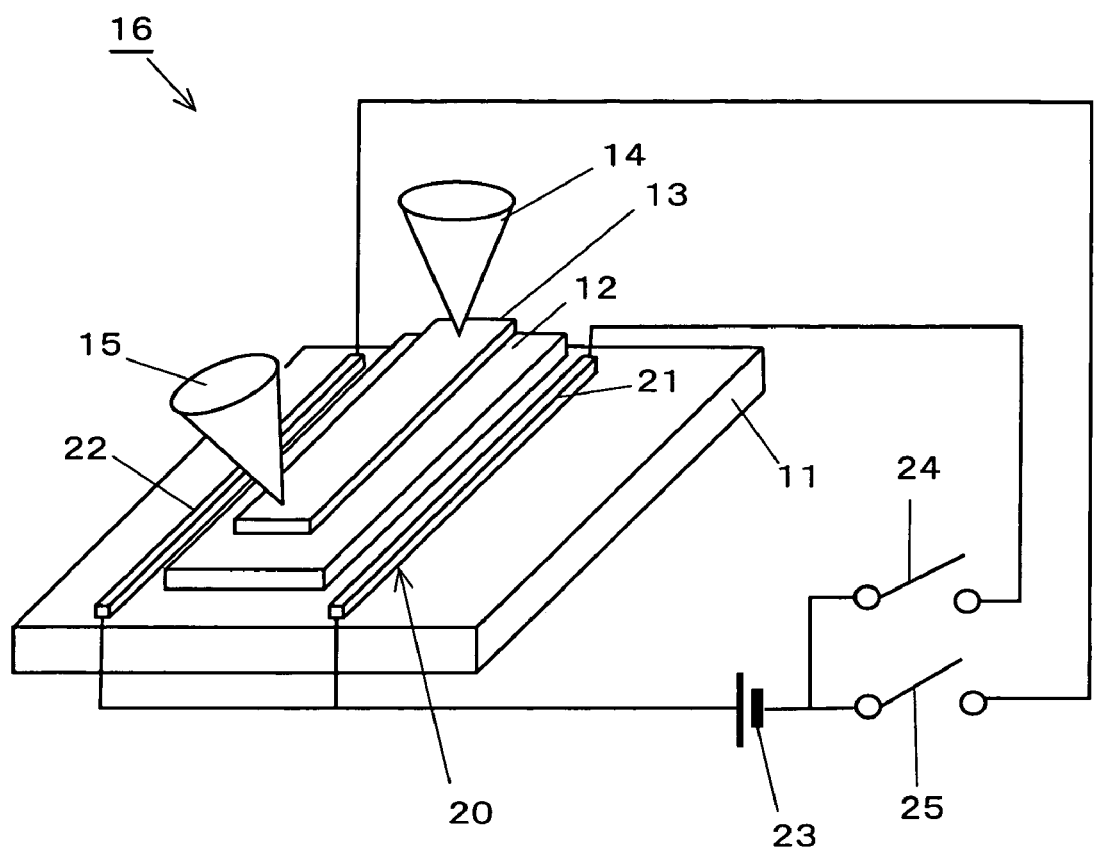
FIG. 5 is a diagrammatic view in perspective illustrating the makeup of a surface-spintronic spin switching device according to the present invention and having a first magnetization switching means.

Referring next to FIG. 5, an explanation is now given in respect of a suitable form of implementation of the surface-spintronic spin switching device in accordance with the present invention. Being a surface-spintronic device, the spin switching element shown designated by reference character 16 in FIG. 5 incorporates a first mechanism for magnetizing the magnetic atom thin film in the normal and reverse directions, which as a magnetization switching means 20 is added to the makeup of the surface-spintronic spin conducting device 10 described above.

The first magnetization switching means comprises two electric current lines 21 and 22, a power supply 23 for these current lines 21 and 22, and two switches 24 and 25 for passing individual electric currents through the electric current lines 21 and 22 from the power supply 23, respectively.

The current lines 21 and 22, the magnetic atom thin film 13 and the power supply 23 are arranged and configured so that a magnetic field generated when the electric current line 21 or 22 has the electric current flow there through has on the magnetic atom thin film a component parallel to its easy axis of magnetization and the magnetic field generated by the electric current flow through the electric current line 21 is oriented opposite to that generated by the electric current flow through the electric current line 22. While as shown the electric current lines 21 and 22 are disposed on the each other sides of the magnetic atom thin film 13 and laid parallel to each other to carry the respective current to flow in the same direction, this is not a limitation. The switch 24 is a switch for normally polarized magnetization that can be turned on to cause the current to flow through the current line 21 from the power supply 23 while the switch 25 is a switch for reversely polarized magnetization that can be turned on to cause the current to flow through the current line 22 from the power supply 23.

Figure 6:
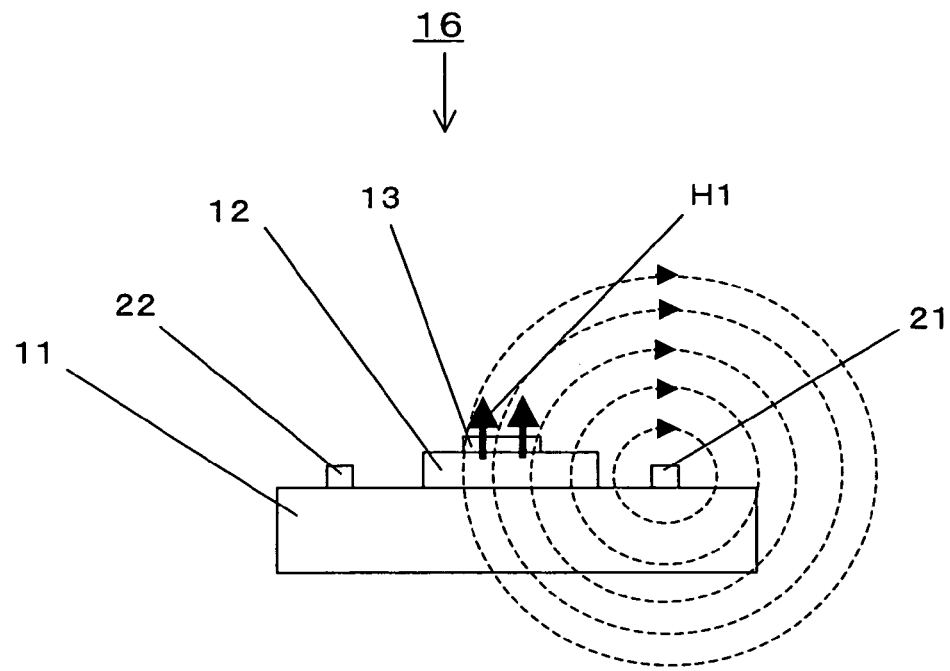
FIG. 6 shows diagrams illustrating principles and states of magnetization switching in the first magnetization switching means.
Figure 6:
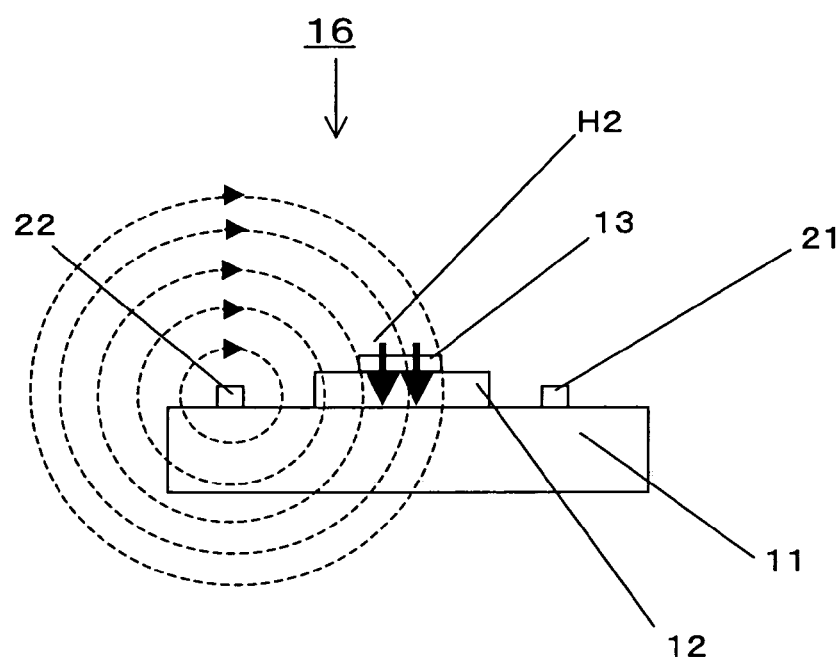

In the surface-spintronic spin switching device 16 with the first magnetization switching means constructed as mentioned above, the electric current is passed to flow though the current line 21 from the power supply 23 when the switch 24 is turned on. This state is illustrated in FIG. 6(A), which depicts a magnetic field distribution in a vertical cross section to the current line 21 and from which it is seen that an upward magnetic field H1 is applied onto the magnetic atom thin film 13 to magnetize it upwards. Thereafter, even with the switch 24 turned off, the magnetic atom thin film 13 by its magnetization holding property remains magnetized upwards, thus retaining the normally polarized state of magnetization.

Therefore, once the switch 24 is turned on, only electrons of up spin can propagate from the source electrode 15 to the drain electrode 14 through the surface electronic state band of the magnetic atom thin film 13. The surface-spintronic spin switching device 16 is rendered conductive when only electrons of up spin are supplied from the source electrode 15. The surface-spintronic spin switching device 16 is rendered nonconductive when only electrons of down spin are supplied from the source electrode 15.

Then, if the switch 24 is turned off and the switch 25 is turned on, the electric current flows through the electric current line 22 from the power supply 23. This state is illustrated in FIG. 6(B), which depicts a magnetic field distribution in a vertical cross section to the electric current line 22 and from which it is seen that a downward magnetic field H2 is applied onto the magnetic atom thin film 13 to magnetize it downwards. Thereafter, even with the switch 25 turned off, the magnetic atom thin film 13 by its magnetization holding property remains magnetized downwards, thus retaining the reversely polarized state of magnetization.

Therefore, once the switch 25 is turned on, only electrons of down spin can propagate from the source electrode 15 to the drain electrode 14 through the surface electronic state band of the magnetic atom thin film 13. The surface-spintronic spin switching device 16 is rendered nonconductive when only electrons of up spin are supplied from the source electrode 15. The surface-spintronic spin switching device 16 is rendered conductive when only electrons of down spin are supplied from the source electrode 15.

When from this state the switch 24 is again turned on, the magnetization of the magnetic atom thin film is switched again into the normal polarity direction so that the surface-spintronic spin switching device 16 can conduct only electrons of up spin. Thus, supplied only with electrons of up spin from the source electrode 15, the surface-spintronic spin switching device 16 is rendered conductive. Supplied only with electrons of down spin from the source electrode 15, the surface-spintronic spin switching device 16 is rendered nonconductive.

In this way, the surface-spintronic spin switching device 16 functions as a spin switching device which is caused to switch its conductive and nonconductive states for a spin current when the direction of its magnetization is switched by the control means.

Figure 7:
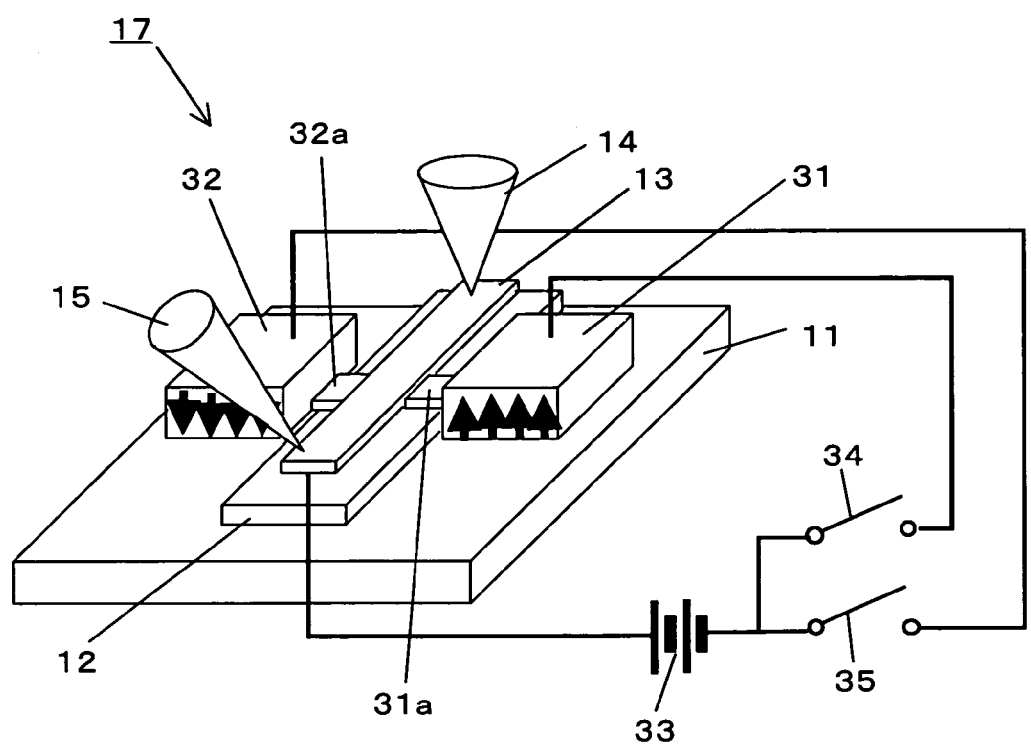
FIG. 7 is a diagrammatic view in perspective illustrating the makeup of a surface-spintronic spin switching device according to the present invention and having a second magnetization switching means.

FIG. 7 shows a surface-spintronic spin switching device 17, which incorporates a second mechanism as the magnetic polarity switching means. The surface-spintronic spin switching device 17 is constructed having the second magnetic polarity switching means added to the surface-spintronic spin conducting device 10.

The second magnetic polarity switching means comprises two spin sources 31 and 32 which are magnetized parallel to an easy axis of magnetization of the magnetic atom thin film 13 and mutually opposite direction; two connections 31a and 32a that connect the magnetic atom thin film 13 to the two spin sources 31 and 32, respectively; a power supply 33 for providing a bias voltage for spin injection; and two switches 34 and 35 for it. The spin sources 31 and 32 are made of ferromagnetic metals which are magnetized in the same directions which are identical to the directions of magnetization in which the magnetic atom thin film 13 are to be normally and reversely magnetized, respectively. Advantageously but not exclusively, the spin sources 31 and 32 are the ferromagnetic metals magnetized upwards and downwards directed perpendicular to their surfaces, respectively, when the solid surface 12 is a copper (111) surface and the magnetic atom thin layer 13 is an iron thin film.

Further, for spin injection by applying a bias voltage between the spin source 31 or 32 and the magnetic atom thin layer 13, the spin sources 31 and 32 are connected to the magnetic atom thin film via the connection members 31a and 32a, respectively. The connection members 31a and 32a may be sufficient if they permit spin injection from the spin sources 31 and 32 into the magnetic atom thin film 13 but are preferably made of nonmagnetic and electrically conductive material whose lattice constant is close to those of the atomic thin film 13 and the spin sources 31 and 32.

The switch 34 is a switch for normally polarized magnetization that can be turned on to apply a bias voltage of a selected magnitude from the power supply 33 between the spin source 31 and the magnetic atom thin film 13. And, the switch 35 is a switch for reversely polarized magnetization that can be turned on to apply a bias voltage of a selected magnitude between the spin source 32 and the magnetic atom thin film 13.

In the surface-spintronic spin switching device 17 with the second magnetic polarity switching means constructed as mentioned above, turning the switch 34 on causes the bias voltage to be applied between the spin source 31 and the magnetic atom thin film 13 and normally polarized spins to be injected into the magnetic atom thin film 13 from the spin source 31, thereby magnetizing the magnetic atom thin film 13 in the normal direction. Thereafter, even with the switch 34 turned off, the magnetic atom thin film 13 by its magnetization holding property remains in the state of magnetization in the normal direction.

Therefore, once the switch 34 is turned on, only electrons of up spin can propagate from the source electrode 15 to the drain electrode 14 through the surface electronic state band of the magnetic atom thin film 13. The surface-spintronic spin switching device 17 is rendered conductive when only electrons of up spin are supplied from the source electrode 15. The surface-spintronic spin switching device 17 is rendered nonconductive when only electrons of down spin are supplied from the source electrode 15.

After the switch 34 is turned off, if the switch 35 is turned on, the bias voltage is applied between the spin source 32 and the magnetic atom thin film 13 to inject reversely polarized spin into the magnetic atom thin film 13 from the spin source 32. This causes the magntic atom thin film 13 to be magnetized in the reverse direction. Thereafter, even with the switch 35 turned off, the magnetic atom thin film 13 by its magnetization holding property remains in the state of magnetization in the reverse directon.

Therefore, once the switch 35 is turned on, only electrons of down spin can flow from the source electrode 15 to the drain electrode 14 through the surface electronic state band on the magnetic atom thin film 13. The surface-spintronic spin switching device 17 is rendered conductive when only electrons of down spin are supplied from the source electrode 15. The surface-spintronic spin switching device 17 is rendered nonconductive when only electrons of up spin are supplied from the source electrode 15.

After the switch 35 is turned off, if the switch 34 is again turned on, the magnerization of the magnetic atom thin film 13 is switched again into the normal polarity direction so that the surface-spintronic spin switching device 17 can conduct only electrons of up spin. Thus, supplied only with electrons of up spin from the source electrode 15, the surface-spintronic spin switching device 17 is rendered conductive. Supplied only with electrons of down spin from the source electrode 15, the surface-spintronic spin switching device 17 is rendered nonconductive.

In this way, the surface-spintronic spin switching device 17 functions as a spin switching device which is caused to switch its conductive and nonconductive states for a spin current when the polarity of its magnetization is switched by normally and reversely polarizing spin injections effected by the second control means.

While each of the surface-spintronic spin switching device 16 and 17 has been shown and described as functioning as a spin switching device that is controllably rendered conductive and nonconductive for a spin current propagating through the magnetic atom thin film, this is not their exclusive use but they can also be used as a surface-spintronic spin memory device using the fact that once the element is switched to a normally or reversely magnetized state, it can retain that state in the magnetic atom thin film until it is switched to the reversely or normally magnetized polarity state. To wit, it is possible to use a direction of magnetization as storage information, to use the magnetization switching means to perform the operation of writing the information, and to detect the state of conduction or nonconductor between the source and drain electrodes 15 and 14 for a spin current to perform the operation of reading the information.

Although the present invention has hereinbefore been set forth with respect to certain illustrative embodiments thereof, it will readily be appreciated to be obvious to those skilled in the art that many alterations thereof, omissions there from and additions thereto can be made without departing from the essences of scope of the present invention. Accordingly, it should be understood that the invention is not intended to be limited to the specific embodiments thereof set forth above, but to include all possible embodiments that can be made within the scope with respect to the features specifically set forth in the appended claims and to encompass all the equivalents thereof.

Industrial Applicability

To establish a state of electrons that bear conduction, a surface-spintronic device according to the present invention utilizes a spin splitting surface electronic state band formed in a system comprised of a solid surface and a magnetic atom thin film layered thereon. Thus, a spin conducting device is realized that can carry a perfect or nearly perfect spin polarized electric current, namely a spin current. Since it allows defining the spin direction of electrons to propagate by controlling the direction of magnetization in the magnetic atom thin film, there is also realized a spin switching device for switching a spin current between states of conduction and nonconductor. Further, using the fact that the magnetic atom thin film externally controlled and thereby brought into a state of magnetization holds that state until a next control is effected thereon, there is realized a spin memory device that can operate to write information on controlling the direction of magnetization of the magnetic atom thin film and to read information on detecting the state of conduction or nonconductor for a spin current. Also, constructed by a system of a solid surface and a magnetic atom thin film layered thereon, the device can confine a spin current into an extremely small space and, as a result, can be made extremely small. Further, in switching a spin current on and off, the device only requires switching the spin polarization normally and reversely in a magnetic atom thin film made of one to several atomic layers. Hence, the required energy is extremely small and there is realized an ultimate energy saving performance. Further, since the switching or memory writing is confined into the micro fine area and is performed by magnetizing normally and reversely the magnetic atom thin film of one to several atomic layer thickness, an ultimate energy saving performance is also achieved. Consequently, there is provided in accordance with the present invention a device that can be implemented as a spin conducting, a spin switching and a spin memory device in the spintronics and also as a magneto resistance device that is extremely large in resistance change.

What is claimed is:

1. A surface-spintronic spin conducting device, characterized in that it comprises a solid surface, a magnetic atom thin film layered on a surface of a solid crystal, and electrodes mounted at two locations on said magnetic atom thin film, whereby a spin splitting surface electronic state band formed in a system comprising said solid crystal surface and said magnetic atom thin film is utilized to cause a spin current to flow.

2. A surface-spintronic spin conducting device as set forth in claim 1, characterized in that said solid surface is a nonmagnetic solid surface having a surface projected bulk band gaps and said magnetic atom thin layer is a magnetic atom thin film having a thickness of one to several atom layers.

3. A surface-spintronic spin conducting device as set forth in claim 2, characterized in that said nonmagnetic crystal surface is a copper (111) surface and said magnetic atom thin film is an iron atom thin film.

4. A surface-spintronic spin conducting device as set forth in claim 2, characterized in that said nonmagnetic crystal surface is a covalent crystal surface so treated that it is terminated with hydrogen and said magnetic atom thin film is an iron atom thin film.

5. A surface-spintronic spin switching device, characterized in that it comprises a solid crystal surface, a magnetic atom thin film layered on a surface of the solid crystal, electrodes disposed at two locations on said magnetic atom thin film, and a control means for controlling the direction of magnetization in said magnetic atom thin film, whereby controlling, by said control means, the spin state of a spin splitting surface electronic state band formed in a system comprising said solid crystal surface and said magnetic atom thin film causes switching on and off a spin current of either a flow of electrons of up spin or a flow of electrons of down spin, of electrons supplied through one of said electrodes from an external spin conducting device.

6. A surface-spintronic spin switching device as set forth in claim 5, characterized in that said solid surface is a surface of a nonmagnetic crystal having a surface projected bulk band gaps and said magnetic atom thin film is a magnetic atom thin film having a thickness of one to several atom layers.

7. A surface-spintronic spin switching device as set forth in claim 6, characterized in that said nonmagnetic crystal surface is a copper (111) surface and said magnetic atom thin film is an iron atom thin film.

8. A surface-spintronic spin switching device as set forth in claim 6, characterized in that said nonmagnetic crystal surface is a covalent crystal surface so treated that it is terminated with hydrogen and said magnetic atom thin film is an iron atom thin film.

9. A surface-spintronic spin switching device as set forth in claim 5, characterized in that it has a control means including a conducting wire disposed laterally adjacent to said magnetic atom thin film and a means for passing an electric current through said conductor to generate around it a magnetic field that is utilized to change the direction of magnetization in said magnetic atom thin film.

10. A surface-spintronic spin switching device as set forth in claim 5, characterized in that said means for controlling the direction of magnetization in said magnetic atom thin film includes:

an up spin and a down spin sources disposed laterally adjacent to said magnetic atom thin film;

a connection member connecting said up spin source to said magnetic atom thin film;

a connection member connecting said down spin source to said magnetic atom thin film;

a power supply for injecting spins of said up spin source and spins of said down spin source into said magnetic atom thin film, and further a means for applying a voltage from said power supply so as to inject spins of said up spin or down spin sources into said magnetic atom thin film, thereby switching its magnetization into a normal or reverse polarity direction.

11. A surface-spintronic spin switching device as set forth in claim 10, characterized in that said up spin and down spin sources comprise ferromagnetic metals magnetized downwards and upwards, respectively, and each of said connection members comprises a nonmagnetic metal.

12. A surface-spintronic spin memory device, characterized in that it comprises a solid surface, a magnetic atom thin film layered on a surface of the solid crystal, electrodes disposed at two locations on said magnetic atom thin film, and a control means for controlling the direction of magnetization in said magnetic atom thin film, whereby controlling, by said control means, the spin state of a spin splitting surface electronic state band formed in a system comprising said solid surface and said magnetic atom thin film causes switching on and off a spin current of either a flow of electrons of up spin or a flow of electrons of down spin, of electrons supplied through one of said electrodes from an external spin conducting device, and wherein said magnetic atom thin film has a magnetization holding property that is utilized to store information.

13. A surface-spintronic spin memory device as set forth in claim 12, characterized in that said solid crystal surface is a surface of a nonmagnetic crystal having a surface projected bulk band gaps, and said magnetic atom thin film is a magnetic atom thin film having a thickness of one to several atom layers.

14. A surface-spintronic spin memory device as set forth in claim 13, characterized in that said nonmagnetic crystal surface is a copper (111) surface and said magnetic atom thin film is an iron atom thin film.

15. A surface-spintronic spin memory device as set forth in claim 13, characterized in that said nonmagnetic crystal surface is a covalent crystal surface so treated that it is terminated with hydrogen and said magnetic atom thin film is an iron atom thin film.

16. A surface-spintronic spin memory device as set forth in claim 12, characterized in that it has a control means including a conducting wire disposed laterally adjacent to said magnetic thin film and a means for passing an electric current through said conductor to generate around it a magnetic field that is utilized to change the direction of magnetization in said magnetic atom thin film.

17. A surface-spintronic spin memory device as set forth in claim 12, characterized in that said control means for controlling the direction of magnetization in said magnetic atom thin film includes:

an up spin and a down spin sources disposed laterally adjacent to said magnetic atom thin film;

a connection member connecting said up spin source to said magnetic atom thin film;

a connection member connecting said down spin source to said magnetic atom thin film;

a power supply for injecting spins of said up spin source and spins of said down spin source into said magnetic atom thin film, and further a means for applying a voltage from said power supply so as to inject spins of said up spin or down spin source into said magnetic atom thin film, thereby switching its magnetization into a normal or reverse polarity direction.

18. A surface-spintronic spin memory device as set forth in claim 17, characterized in that said up spin and down spin sources comprise ferromagnetic metals magnetized downwards and upwards, respectively, and each of said connection members comprises a nonmagnetic metal.

* * * * *